United States Patent
Raley et al.

(10) Patent No.: US 9,786,503 B2
(45) Date of Patent: Oct. 10, 2017

(54) METHOD FOR INCREASING PATTERN DENSITY IN SELF-ALIGNED PATTERNING SCHEMES WITHOUT USING HARD MASKS

(71) Applicant: Tokyo Electron Limited, Minato-ku, Tokyo (JP)

(72) Inventors: Angelique D. Raley, Mechanicville, NY (US); Nihar Mohanty, Albany, NY (US); Akiteru Ko, Schenectady, NY (US)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 15/089,961

(22) Filed: Apr. 4, 2016

(65) Prior Publication Data

US 2016/0300718 A1  Oct. 13, 2016

Related U.S. Application Data

(60) Provisional application No. 62/144,581, filed on Apr. 8, 2015.

(51) Int. Cl.
*H01L 21/302* (2006.01)
*H01L 21/461* (2006.01)
(Continued)

(52) U.S. Cl.
CPC ...... *H01L 21/0337* (2013.01); *H01L 21/0273* (2013.01); *H01L 21/02205* (2013.01);
(Continued)

(58) Field of Classification Search
None
See application file for complete search history.

(56) References Cited

U.S. PATENT DOCUMENTS

| | | | |
|---|---|---|---|
| 6,905,626 B2 * | 6/2005 | Westerman | H01L 21/30655 216/37 |
| 8,497,213 B2 | 7/2013 | Yasui et al. | |
| 8,623,770 B1 * | 1/2014 | Gao | H01L 21/02186 257/E21.236 |
| 8,945,408 B2 | 2/2015 | Chakrapani et al. | |
| 2007/0065990 A1 * | 3/2007 | Degroote | H01L 21/0337 438/142 |
| 2007/0111110 A1 * | 5/2007 | Lin | G03F 7/40 430/5 |

(Continued)

FOREIGN PATENT DOCUMENTS

TW  200845185 A  11/2008

OTHER PUBLICATIONS

Office Action dated Mar. 17, 2017 in corresponding Taiwan Patent Application No. 105110844 (with an English translation) (13 pages).

*Primary Examiner* — Stephanie Duclair
(74) *Attorney, Agent, or Firm* — Rothwell, Figg, Ernst & Manbeck, P.C.

(57) ABSTRACT

Provided is a method for increasing pattern density of a structure using an integration scheme and perform pitch splitting at the resist level without the use of hard mandrels, the method comprising: providing a substrate having a patterned resist layer and an underlying layer comprising a silicon anti-reflective coating layer, an amorphous layer, and a target layer; performing a resist hardening process; performing a first conformal spacer deposition using an atomic layer deposition technique with an oxide, performing a spacer first reactive ion etch process and a first pull process on the first conformal layer, performing a second conformal spacer deposition using titanium oxide; performing a second spacer RIE process and a second pull process, generating a second spacer pattern; and transferring the second spacer pattern into the target layer, wherein targets include patterning uniformity, pulldown of structures, slimming of structures, aspect ratio of structures, and line width roughness.

20 Claims, 13 Drawing Sheets

(51) Int. Cl.
*C03C 15/00* (2006.01)
*C03C 25/68* (2006.01)
*C23F 1/00* (2006.01)
*B44C 1/22* (2006.01)
*H01L 21/033* (2006.01)
*H01L 21/311* (2006.01)
*H01L 21/027* (2006.01)
*H01L 21/02* (2006.01)

(52) U.S. Cl.
CPC .... *H01L 21/02208* (2013.01); *H01L 21/0332* (2013.01); *H01L 21/31144* (2013.01); *H01L 21/0228* (2013.01); *H01L 21/02164* (2013.01); *H01L 21/02186* (2013.01); *H01L 21/31116* (2013.01); *H01L 21/31122* (2013.01); *H01L 21/31138* (2013.01)

(56) References Cited

U.S. PATENT DOCUMENTS

| | | | |
|---|---|---|---|
| 2008/0057692 A1* | 3/2008 | Wells | H01L 21/0337 438/597 |
| 2009/0017627 A1* | 1/2009 | Greeley | H01L 21/0337 438/697 |
| 2009/0311634 A1* | 12/2009 | Yue | H01L 21/0337 430/323 |
| 2010/0112483 A1* | 5/2010 | Wing Ngai | H01L 21/0273 430/296 |
| 2012/0244458 A1 | 9/2012 | Luong et al. | |
| 2013/0084688 A1 | 4/2013 | O'Meara et al. | |
| 2014/0154887 A1 | 6/2014 | Trivedi et al. | |
| 2015/0056800 A1 | 2/2015 | Mebarki et al. | |

* cited by examiner

METHOD FOR INCREASING PATTERN DENSITY IN SELF-ALIGNED PATTERNING SCHEMES WITHOUT USING HARD MASKS

BACKGROUND OF THE INVENTION

Field of Invention

The present invention relates to a method and system for substrate processing, and more particularly to a method and system for increasing the density of structures fabricated in a substrate while maintaining the integrity of the structures to hold up in further processing.

Description of Related Art

In semiconductor manufacturing patterning of a film on a substrate can be achieved through several methods that have evolved with time to follow Moore's law. The first method is conventional lithography which can no longer be used alone to achieve advanced nodes critical dimensions (CD).

Quadruple patterning is the technique used to create hard mask features smaller than photolithographic capabilities by using spacer deposition to define feature dimensions. Typical quadruple patterning (QP) techniques require a first sequence of deposition over a mandrel, etch to form the spacer and another etch to remove the mandrel, with both deposition and etch tools required and a second sequence of deposition over a mandrel, etch to form the spacer and another etch to remove the mandrel. There are some spatial limitations inherent in the conventional QP technique due to deposition 'thin-ness' limitations and pitch of the features from mandrel formation limitations. It is now combined with additional techniques such as self-aligned quadruple patterning (SAQP), (directed self-assembly) to achieve the required CD. These methods can become costly and add several steps to the process. Advanced extreme ultra violet (EUV) lithography should be able to alleviate some of these issues once available but the constant drive to smaller CD will remain a challenge for the future technologies to come.

There is a concern that the structures in the SAQP structures may not have the structural integrity to hold up in further processing. As a result, the aspect ratios of the structures need to be monitored and controlled to suit the application. Due to added cost of depositing the layers and later selectively etching these layers, there are cost and time issues that need to be addressed.

There is a need to fabricate structures with a CD in the range lower than those obtained using current photolithography techniques. More specifically, there is a need to: (1) get the CD of structures below a certain nanometer range without using EUV lithography; (2) minimize the setup time of the integration steps to increase effective throughput, (3) minimize the number of tools needed to complete the process, and/or (4) reduce the cost of ownership. One such approach is the present invention where no hard mandrels are used, the pitch splitting is done at the resist level, and the high density pattern is not transferred until at the very end of the integration scheme.

SUMMARY OF THE INVENTION

Provided is a method for increasing pattern density of a structure on a substrate using an integration scheme, the integration scheme configured to meet integration targets, to perform pitch splitting at the resist level and without the use of hard mandrels, the method comprising: providing a substrate having a patterned resist layer and an underlying layer, the underlying layer comprising a silicon anti-reflective coating layer (SiARC), an amorphous layer, and a target layer; performing a resist hardening process on the patterned resist layer in order to maintain square top pattern retention; performing a first conformal spacer deposition using an atomic layer deposition technique with an oxide, the deposition creating a first conformal layer above the patterned resist layer; performing a spacer first reactive ion etch (RIE) process and a first pull process on the first conformal layer, the first RIE process and a first pull process creating a first spacer pattern; performing a second conformal spacer deposition using titanium oxide, the deposition creating a second conformal layer; performing a second spacer RIE process and a second pull process, the second pull process on the second conformal layer, generating a second spacer pattern; and transferring the second spacer pattern into the target layer, the transferring generating a target pattern; wherein the integration targets include patterning uniformity (uniformity), pulldown of structures (pulldown), slimming of structures (slimming), aspect ratio of structures (aspect ratio), and line width roughness.

Also provided is a method for increasing pattern density of a structure on a substrate using an integration scheme, the integration scheme configured to meet integration targets, to perform pitch splitting at the resist level and without the use of hard mandrels, the method comprising: providing a substrate having a patterned resist layer and an underlying layer, the underlying layer comprising a bottom anti-reflective coating (BARC), a silicon oxynitride layer (SiON), an amorphous layer, and a target layer; performing a resist trim and curing process and a BARC etch process; performing a first conformal spacer deposition using an atomic layer deposition technique with an oxide, the deposition creating a first conformal layer above the patterned resist layer; performing a spacer first reactive ion etch (RIE) process and a first pull process on the first conformal layer, the first RIE process and a first pull process creating a first spacer pattern.

The method further comprises performing a second conformal spacer deposition using titanium oxide, the deposition creating a second conformal layer; performing a second spacer RIE process and a second pull process, the second pull process on the second conformal layer, generating a second spacer pattern; and transferring the second spacer pattern into the target layer, the transferring generating a target pattern; wherein the integration targets include patterning uniformity (uniformity), pulldown of structures (pulldown), slimming of structures (slimming), aspect ratio of structures (aspect ratio), and line width roughness; wherein the atomic layer deposition with an oxide comprises one of Al2O3, ZrO2, HfO2, RuO, or AlN; and wherein the first conformal atomic layer deposition with an oxide comprises TiO and the second conformal atomic layer deposition comprises SiO2.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

FIG. 7D is an exemplary image of a film stack without a spacer reformation etch process being performed whereas

DETAILED DESCRIPTION OF EMBODIMENTS OF THE INVENTION

Figure 1:
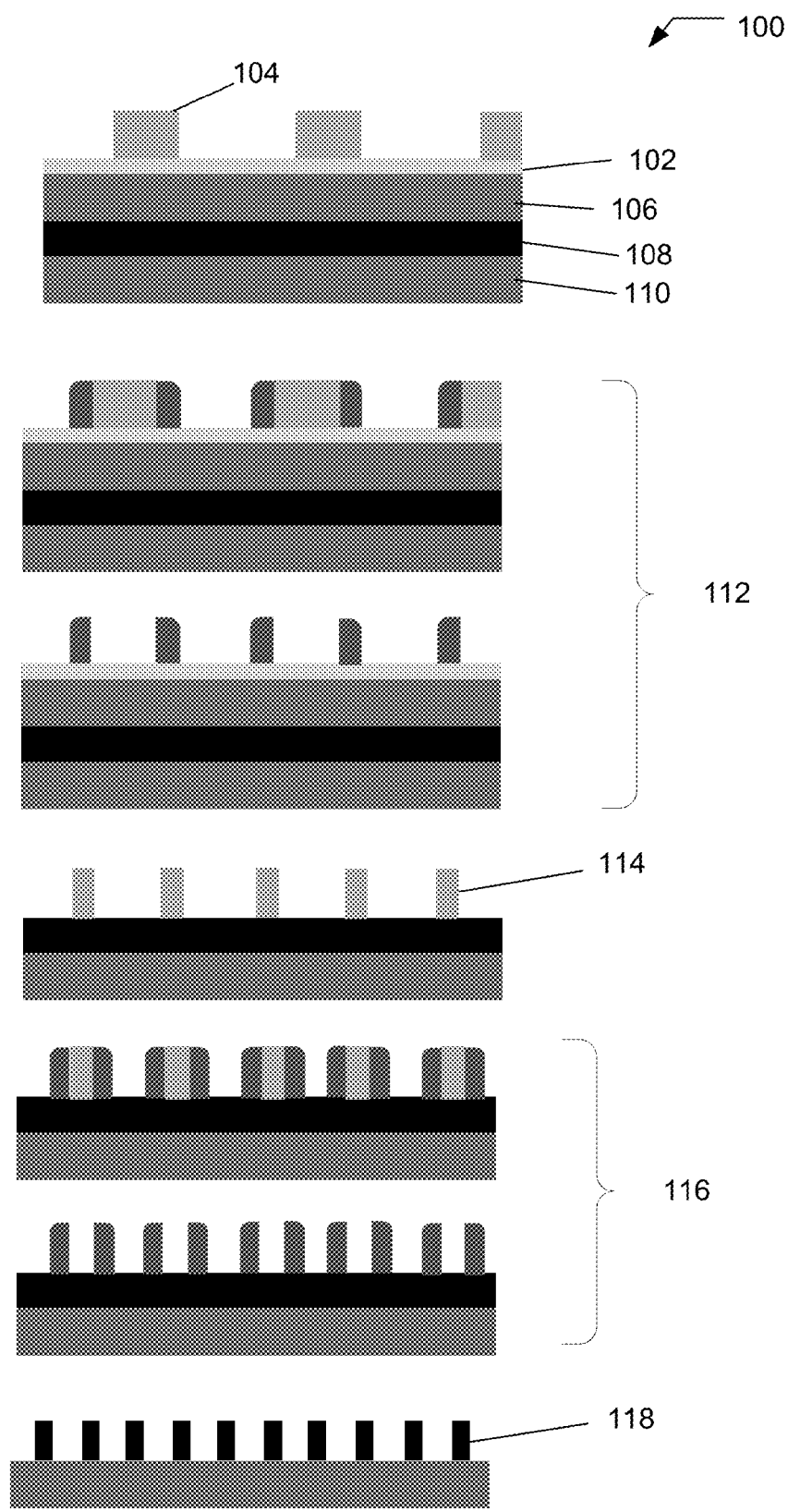
FIG. 1 depicts an exemplary integration scheme of prior art SAQP flow.

Methods and systems for patterning sidewall shapes are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, where like reference numerals designate identical or corresponding parts throughout the several views.

FIG. 1 depicts an exemplary integration scheme 100 of prior art self-aligned quadruple patterning (SAQP) flow. The typical SAQP film stack starts with a mandrel 104 on hardmask 102, a second mandrel layer 106, a target layer 108, and substrate 110. The next steps of processing include a deposition step and etch step 112. Further processing of the film stack creates the second mandrel 114. A second set of steps include a deposition and an etch step 116. The target pattern 118 is finally transferred into the target layer 108.

Figure 2A:
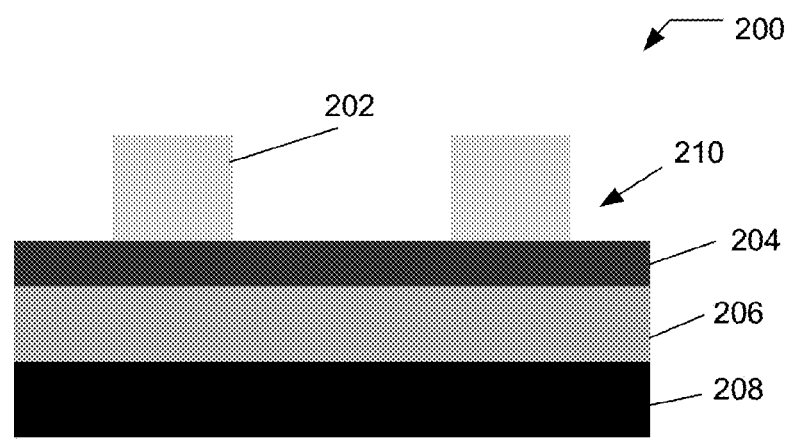
FIG. 2A depicts a schematic of an initial input film stack to an integration scheme in an embodiment of the present invention.
Figure 2B:
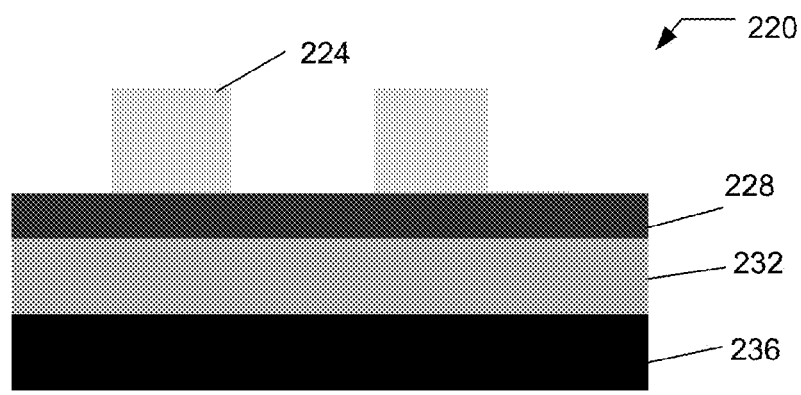
FIG. 2B depicts a schematic of a resist hardening step of an integration scheme in an embodiment of the present invention.

FIG. 2A depicts a schematic 200 of an initial input film stack 210 to an integration scheme in an embodiment of the present invention. The input film stack 210 includes a resist pattern 202, a silicon anti-reflective coating (SiARC) 204, an advanced patterning film 206 that could be 50 nm or less, and a target layer 208. FIG. 2B depicts a schematic 220 of a resist hardening step of an integration scheme in an embodiment of the present invention. The resist hardening step is configured to harden the resist and maintain the square top pattern shape. Resist hardening can be conducted using a plasma curing process during which the vacuum ultra violet radiation of the plasma along with the ion flux/radical species densify the resist. Examples of plasma curing of the resist are done with HBr plasma, hydrogen plasma, argon plasma mixed with additive gases such as CH4. Another technique of resist hardening is direct current superpositioning, described in U.S. patent application Ser. No. 13/918,794, ETCH PROCESS FOR REDUCING DIRECTED SELF ASSEMBLY PATTERN DEFECTIVITY, now U.S. Pat. No. 8,945,408 issued on Feb. 3, 2015.

Figure 2C:
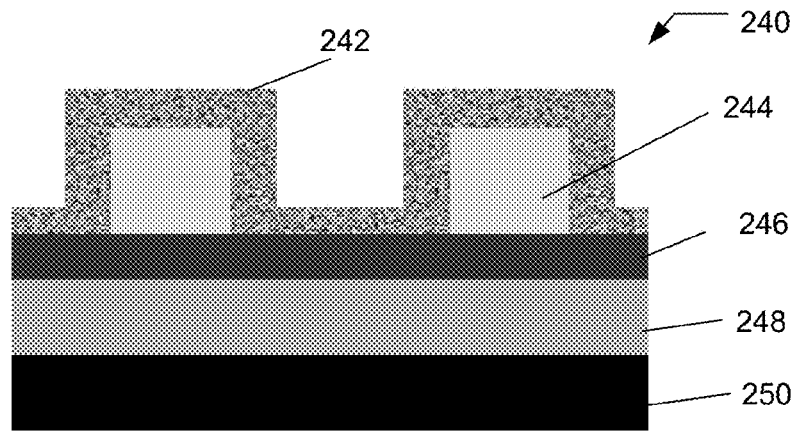
FIG. 2C depicts a schematic of first conformal atomic layer deposition (ALD) in an integration scheme in an embodiment of the present invention.
Figure 2D:
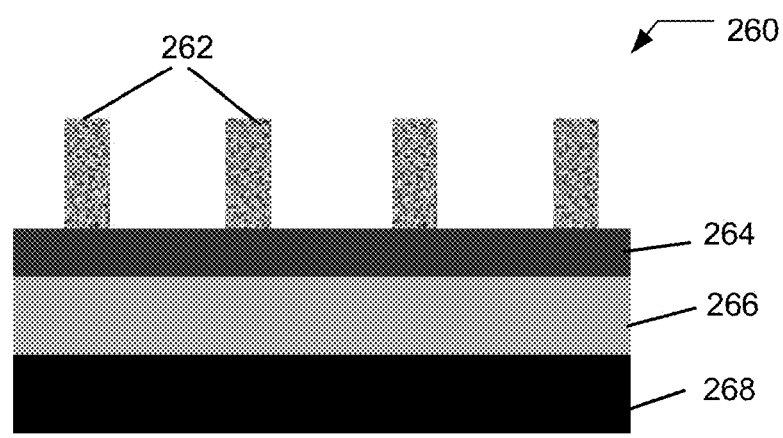
FIG. 2D depicts a schematic of a first ALD spacer reaction in etch (RIE) and resist pull in an integration scheme in an embodiment of the present invention.

FIG. 2C depicts a schematic 240 of first conformal atomic layer deposition (ALD) in an integration scheme in an embodiment of the present invention. A conformal layer 242 is deposited on top of the hardened resist structure 244. FIG. 2D depicts a schematic 260 of a first ALD spacer reaction in etch (RIE) and resist pull in an integration scheme in an embodiment of the present invention. The RIE can use a CxFy chemistry with dilution of the gas with either argon or helium. The resist pull can be performed using oxygen plasma with a low bias in a range from 1 to 50 mHz. The conformal deposition, RIE and resist pull are known by people in the art.

Figure 2E:
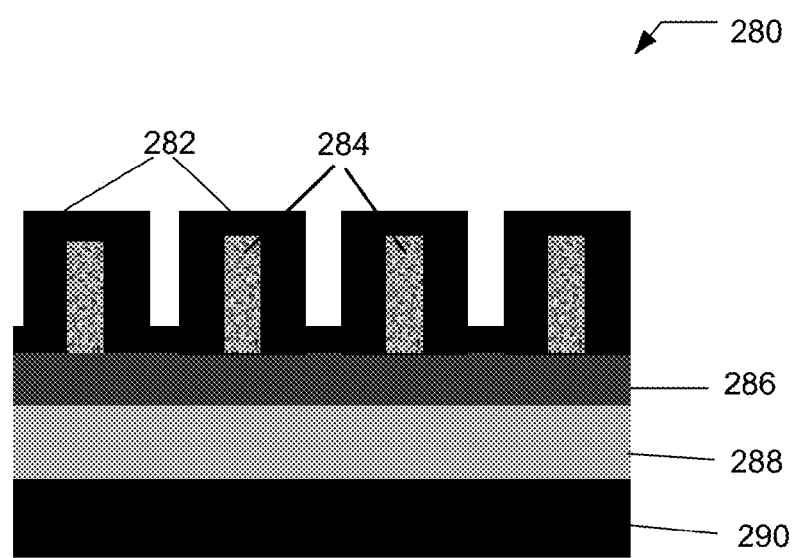
FIG. 2E depicts a schematic of a second conformal ALD of an integration scheme in an embodiment of the present invention.
Figure 2F:
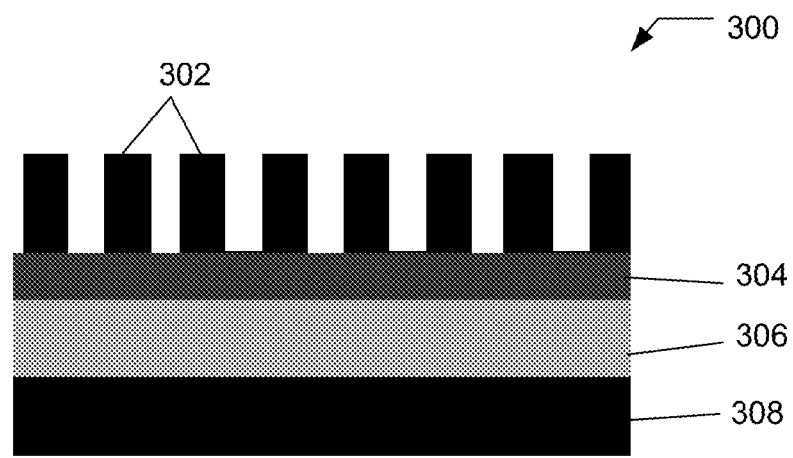
FIG. 2F depicts schematic of a second ALD RIE and a pull of the oxide spacer in an integration scheme in an embodiment of the present invention.

FIG. 2E depicts a schematic 260 of a second conformal ALD of an integration scheme in an embodiment of the present invention. The second ALD involves a low temperature conformal layer deposition of titanium oxide. FIG. 2F depicts schematic 280 of a second ALD RIE and a pull of the oxide spacer in an integration scheme in an embodiment of the present invention. The second RIE can be etched using BCl3 plasma. The pull for the oxide spacer can use etch chemistry selective to the titanium dioxide spacer and to the SiARC. The oxide spacer pull can be performed using oxygen plasma with a low bias in a range from 1 to 50 mHz. After the oxide spacer pull, the resulting pattern is the second spacer which is the equivalent of performing a traditional SAQP using two hard mandrels and multiple deposition and etch steps that are avoided in the present invention.

In another embodiment, instead of a resist, a titanium oxide spacer can be used, where the titanium oxide spacer is etched and then used as first mandrel for the second spacer deposition of silicon dioxide, then performing the spacer RIE. Finally, (a) other materials for the atomic layer deposition with an oxide can comprise one of Al2O3, ZrO2, HfO2, RuO, or AlN; (b) an alternative embodiment where the first conformal atomic layer deposition with an oxide can comprise TiO and the second conformal atomic layer deposition can comprise SiO2.

Figure 3A:
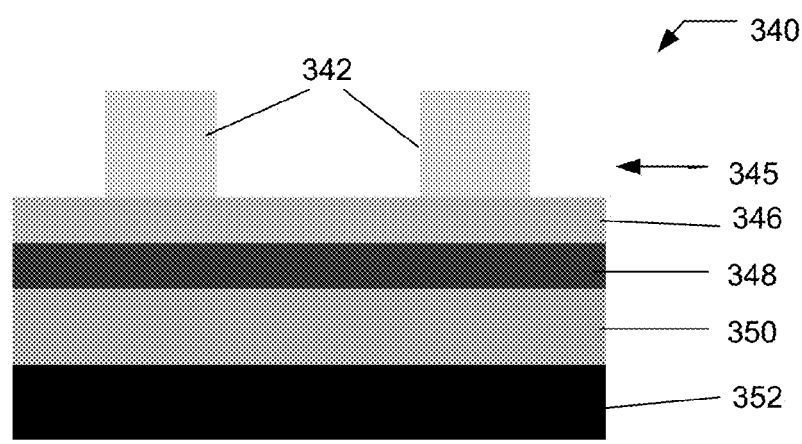
FIG. 3A is an exemplary schematic of incoming substrate with an input film stack in an integration scheme of an embodiment of the present invention.
Figure 3B:
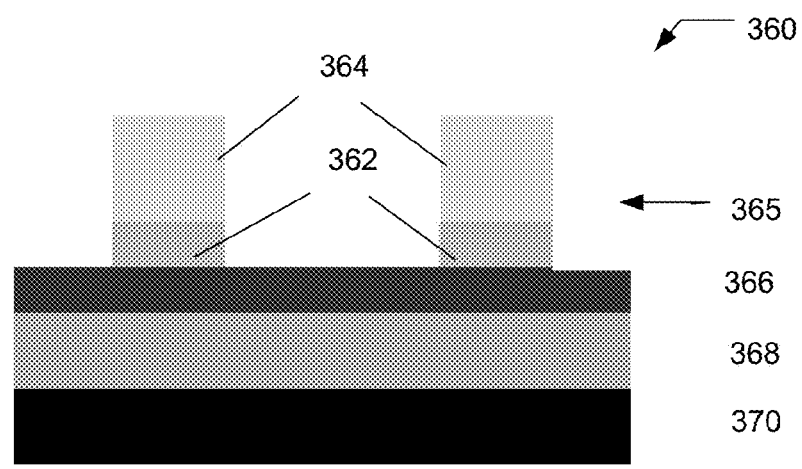
FIG. 3B is an exemplary schematic of the film stack after resist trim, cure and BARC etch in an integration scheme of an embodiment of the present invention.
Figure 3C:
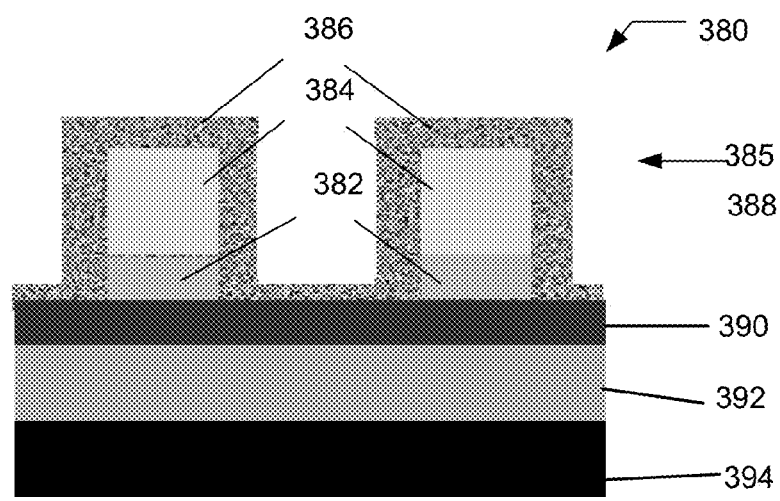
FIG. 3C is an exemplary schematic of the film stack after a first conformal ALD in an integration scheme of an embodiment of the present invention.

FIG. 3A, FIG. 3B, and FIG. 3C is an alternative embodiment to the original embodiment described in relation to FIG. 2A, FIG. 2B, and FIG. 2C. FIG. 3A is an exemplary schematic 340 of incoming structure 345 on an input film stack in an integration scheme of an embodiment of the present invention. The resist 342 is on top of film stack comprising a silicon bottom anti-reflective coating (SiARC) 346 where the thickness can be in a range from 50 nm or less, a silicon oxynitride layer (SiON) 348, an advanced patterning film (APF) 350 that can be 50 nm or less, and a target layer 352. FIG. 3B is an exemplary schematic 360 of the film stack after resist trim, cure, and BARC etch in an integration scheme of an embodiment of the present invention. The resist trim, cure, and BARC etch can all be done in the same processing chamber, thus having a negligible impact to substrate throughput. The film stack comprises a structure 365 with a top layer of resist 364, a SiARC layer 363, a SiON layer 366, an APF layer 368, and a target layer 370. FIG. 3C is an exemplary schematic 380 of the film stack after a conformal deposition in an integration scheme of an embodiment of the present invention and is similar to process described in relation to FIG. 2C. The film stack comprises the structure 385, a conformal ALD layer 386, resist 384, the SiARC layer 382, the SiON layer 390, the APF layer 392, and the target layer 394. The substrate that is depicted FIG. 3C undergoes the same processing as that described in relation to FIG. 2D, FIG. 2E, and FIG. 2F of the original embodiment.

Figure 4A:
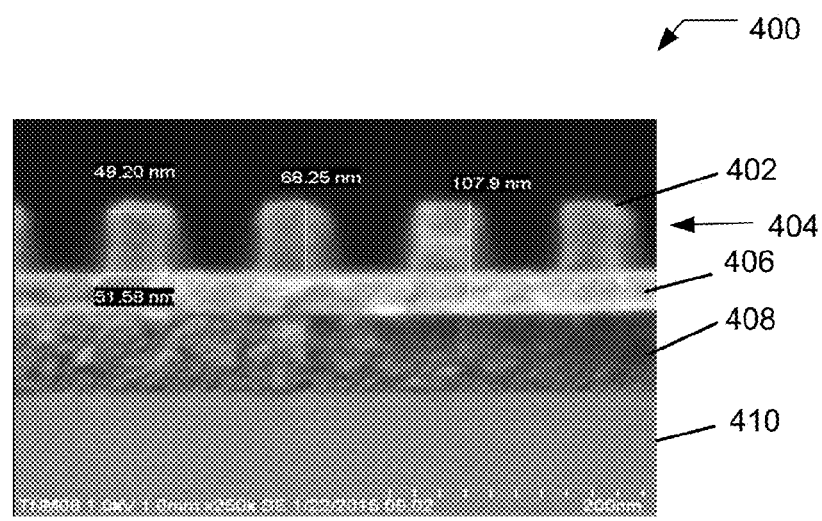
FIG. 4A is an exemplary image of structures after undergoing an ALD RIE and resist pull in an integration scheme of an embodiment of the present invention.
Figure 4B:
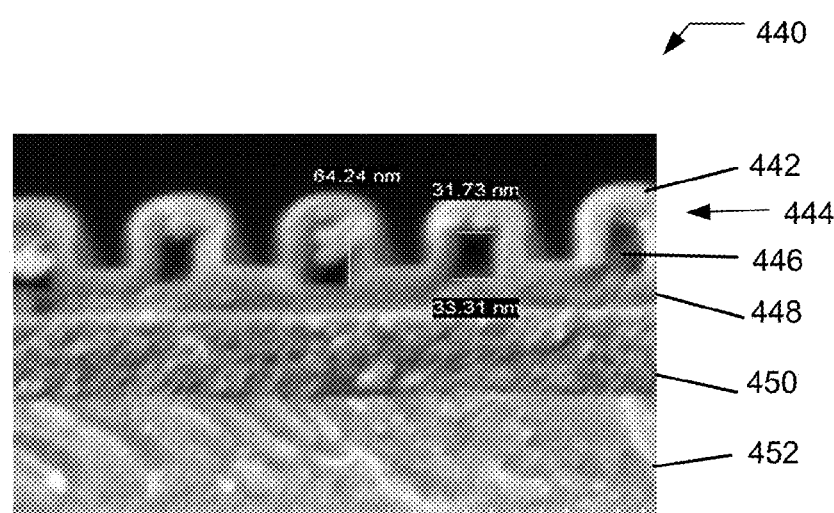
FIG. 4B is an exemplary image of the second spacer deposition in an integration scheme of an embodiment of the present invention.
Figure 4C:
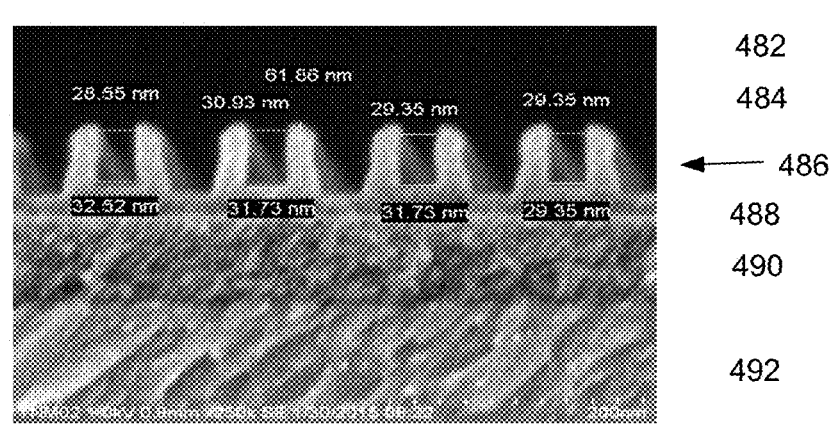
FIG. 4C is an exemplary image of an oxide pull in an integration scheme of an embodiment of the present invention.

FIG. 4A is an exemplary image 400 of structures 404 after undergoing an ALD RIE and resist pull in an integration scheme of an embodiment of the present invention. The film stack comprises a structure 404 comprising the resist 402, and the layers of SiARC 406, layer of APF 408, and target layer 410. FIG. 4B is an exemplary image 440 of the second spacer deposition in an integration scheme of an embodiment of the present invention. The film stack comprises a structure 444 comprising the conformal layer 442, resist 446, and the layers of SiARC 448, APF 450, and target layer 452. FIG. 4C is an exemplary image 480 of an oxide pull in an integration scheme of an embodiment of the present invention. The film stack comprises a structure 486 comprising the spacer 482 and the layers of SiARC 488, APF 490, and target layer 492.

Figure 5:
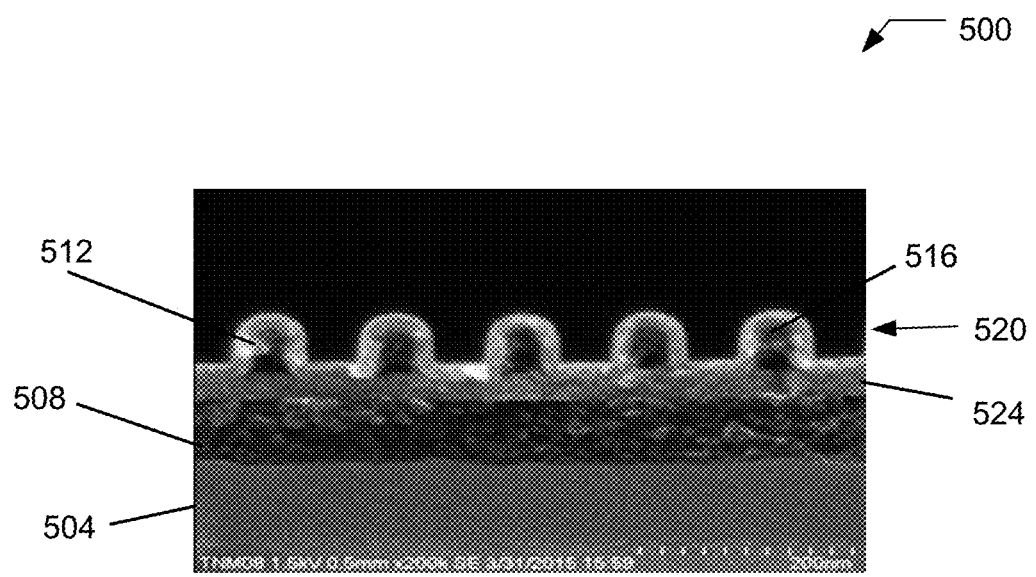
FIG. 5 depicts an exemplary image of a post first spacer deposition in the SAQP integration scheme in an embodiment of the present invention.

FIG. 5 depicts an exemplary image 500 of a post first spacer deposition in the SAQP integration scheme in an embodiment of the present invention. The resist 516 is conformally coated with a deposition of titanium oxide spacer 512. The structures 520 are the result of the first spacer deposition in self aligned quadrilateral patterning scheme of the present invention where the structures are above the SiARC layer 524, the amorphous carbon layer 508 and the target pattern layer 504.

Figure 6A:
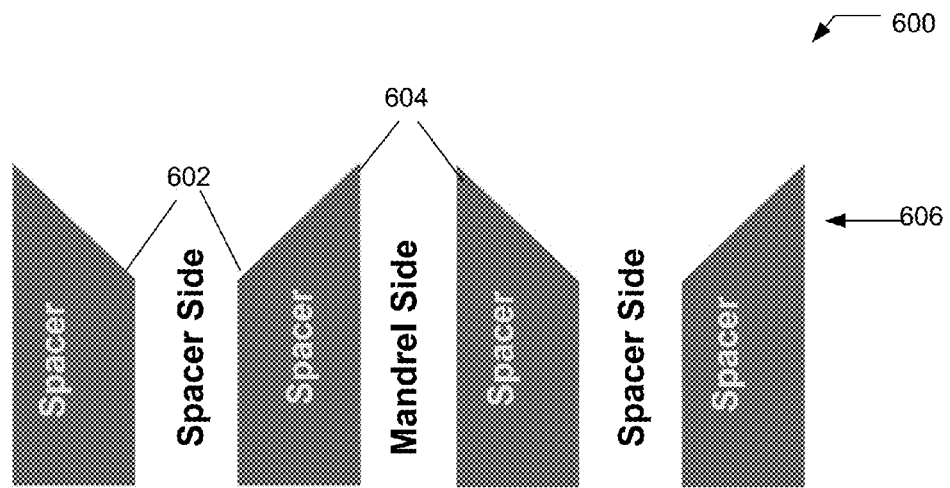
FIG. 6A is an exemplary schematic of asymmetric spacer profiles highlighting difference in mask heights on the mandrel side versus the spacer side of a mandrel.
Figure 6B:
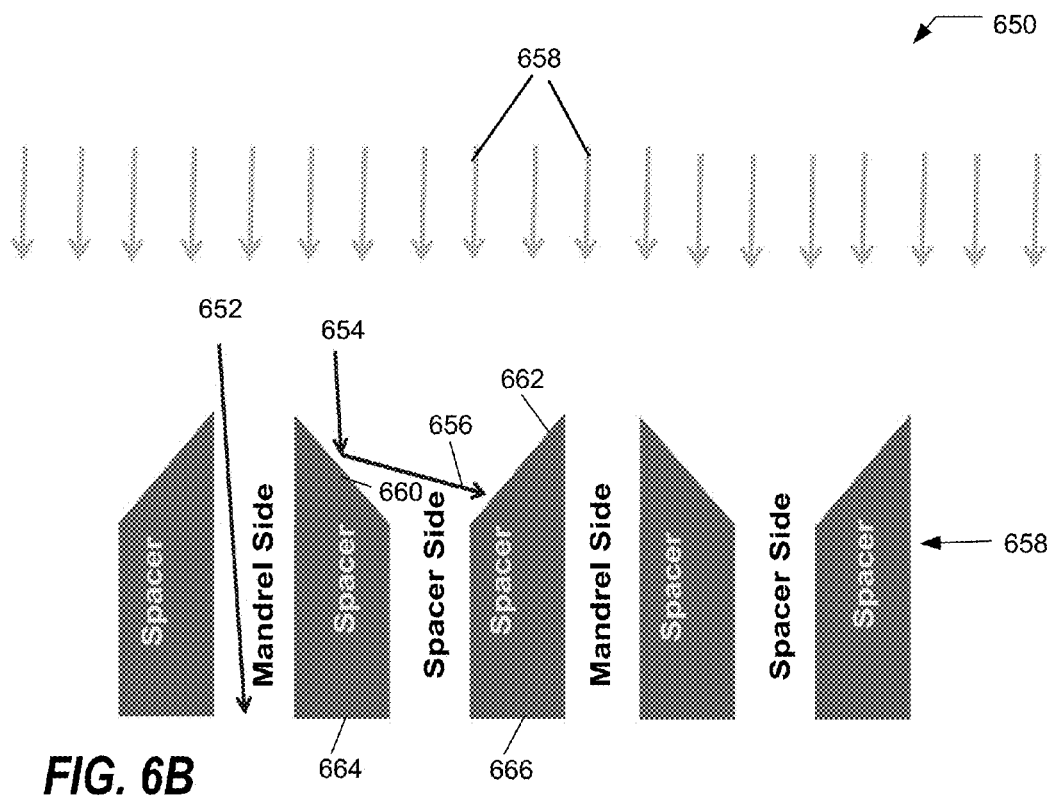
FIG. 6B is an exemplary schematic of different off-normal ion behavior due to specular reflection.

FIG. 6A is an exemplary schematic 600 of asymmetric spacer profiles highlighting a difference in mask heights on the mandrel side 604 versus the spacer side 602 of the structure 606. The spacer structures 606 are taller on mandrel side 604 than the spacer side 602. There is a need to bring the relative mask heights closer to a desired CD height range; this issue will be addressed in spacer reformation discussion in connection with FIG. 7A, FIG. 7B, AND FIG. 7C below. FIG. 6B is an exemplary schematic 650 of different off-normal ion behavior due to specular reflection. The normal ion fluxes 658 are typically directed downward towards the structures 658. Some of the ion fluxes are directed at an oblique angle towards the structures 658 while some of the oblique angle fluxes 654 hit a facet of the structure 660 and bounces at close to parallel to the base of the structures striking the opposite facet of the structure 666, causing some degradation of the mask.

Figure 7A:
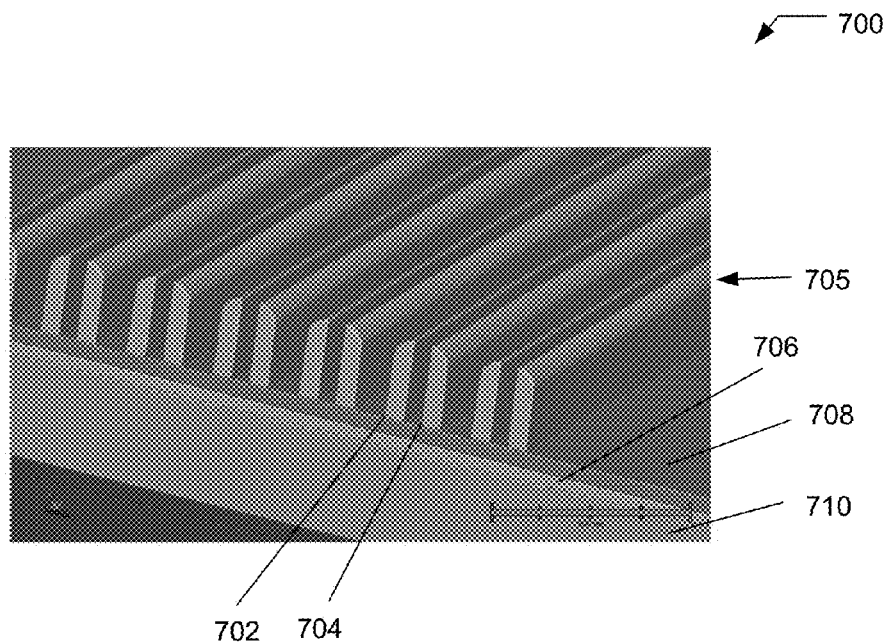
FIG. 7A is an exemplary schematic of spacer reformation for symmetric spacer profile with an organic planarizing layer (OPL) coat in an embodiment of the present invention.
Figure 7B:
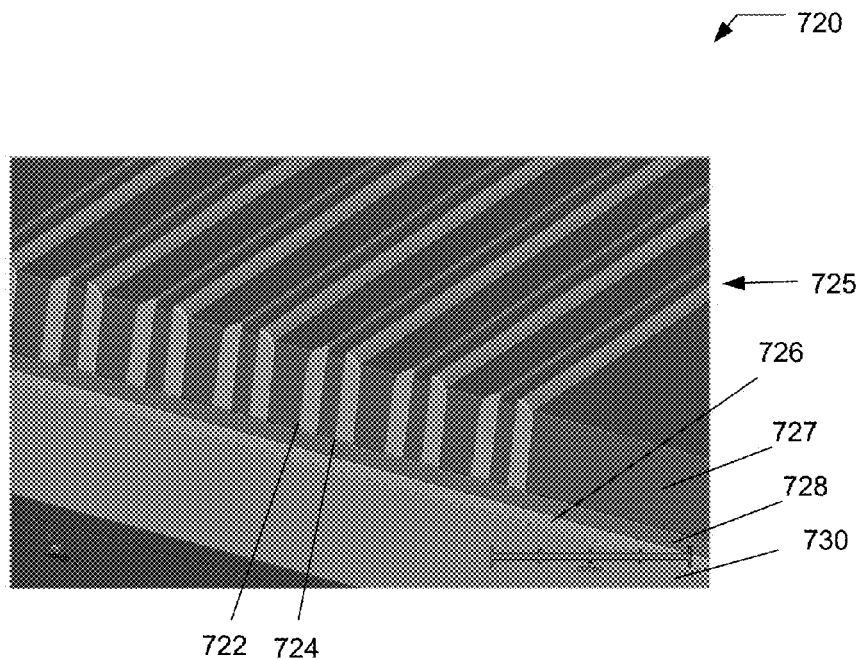
FIG. 7B is an exemplary schematic of input film stack of a spacer reformation process for symmetric spacer profile with a partial etch back of the OPL coat in an embodiment of the present invention.
Figure 7C:
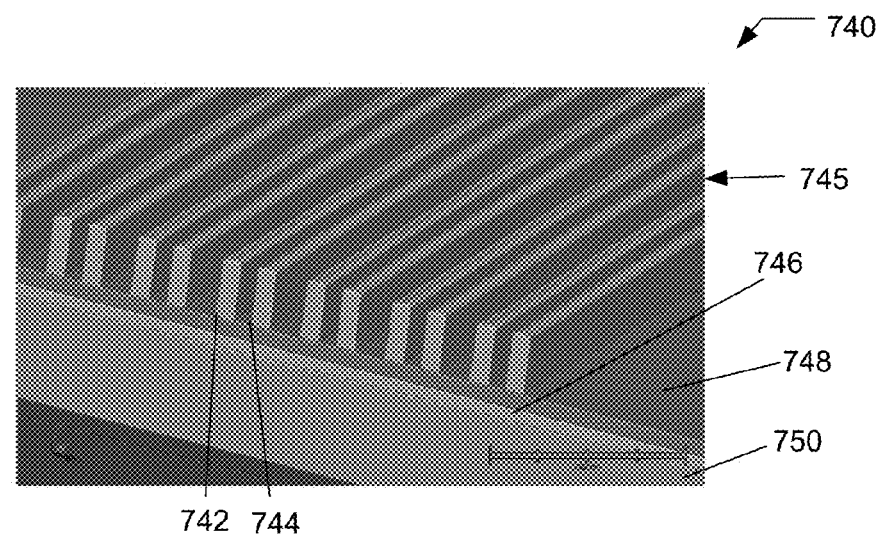
FIG. 7C is an exemplary schematic of the film stack of a spacer reformation etch process with high selectivity to OPL in an embodiment of the present invention.

FIG. 7A is an exemplary schematic 700 of an input spacer structure 705 to a spacer reformation processing for a more symmetric spacer profile using an organic planarizing layer (OPL) coat in an embodiment of the present invention. As noted above, the spacer side 702 is lower in height than the mandrel side 704 of the structures 705 above the underlying layers 708, 706, and 710. FIG. 7B is an exemplary schematic 720 of spacer structure 725 after applying an OPL coat 728 and partial etch back of the structures 705 above the underlying layers 726, 728, and 730 in an embodiment of the present invention. FIG. 7C is an exemplary schematic 740 of spacer structures 745 after the reformation etch with high selectivity to OPL. Note that the spacer side 742 and the mandrel side 744 of the structures 725 are substantially in the same height range. The OPL coat 727 in FIG. 7B has been etched completely and do not show in the schematic 740 of FIG. 7C.

Figure 7D:
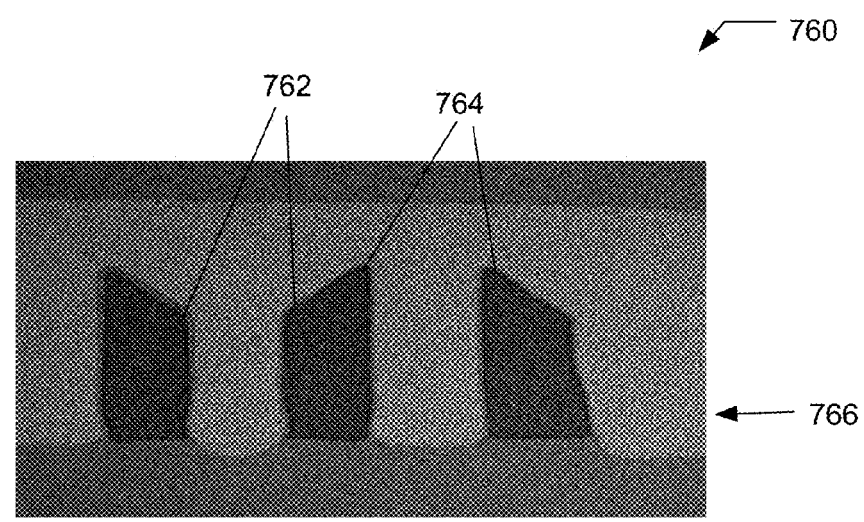
Figure 7E:
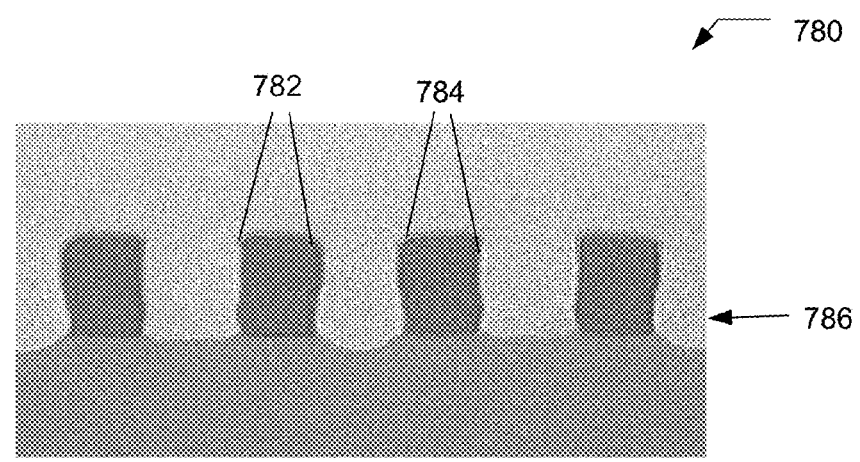
FIG. 7E is an image of a film stack after spacer reformation is performed.
Figure 8A:
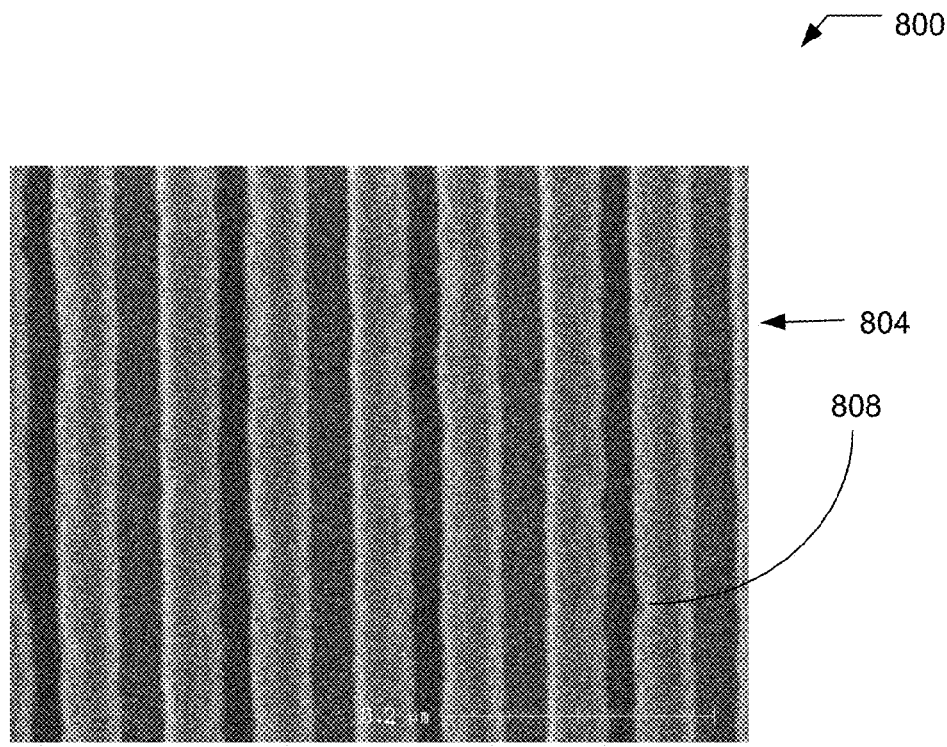
FIG. 8A is an exemplary top-down image of a post full etch without spacer reformation.
Figure 8B:
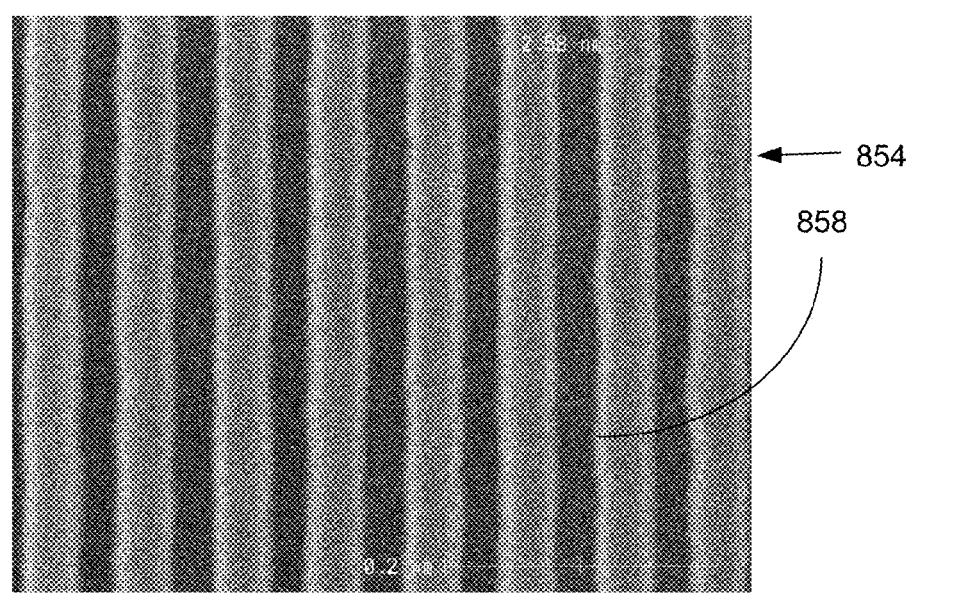
FIG. 8B is an exemplary top-down image of a post full etch with spacer reformation highlighting the improvements in line width roughness (LWR) and and line edge roughness (LER,) (not shown).

Further proof of the effect of spacer reformation processing by comparing an exemplary image 760 of spacer prior to reformation processing of FIG. 7D where the incoming spacer profile shows the lower heights of the structure 766 at the spacer side 762 than at the mandrel side 764. In contrast after spacer processing, an exemplary image 780 of a spacer profile after spacer reformation in FIG. 7E shows the spacer heights 782 and 784 are substantially in the same height range. Using top down images of the structures, the spacer reformation process also improves the line width roughness (LWR) and line edge roughness (LER) of the structures (not shown). This is highlighted in the FIG. 8A, which is an exemplary top-down image 800 of a post full etch without spacer reformation and FIG. 8B, which is an exemplary top-down image 850 of a post full etch with spacer reformation. Referring to FIG. 8A, the structures 804 without undergoing spacer reformation show line width roughness 808 of about 4.0 nm. After spacer reformation, the same structures 854 showed an LWR of about 3.0 nm or an improvement of about 1 nm. The inventors found a similar range of improvement with line edge roughness, (not shown).

Figure 9A:
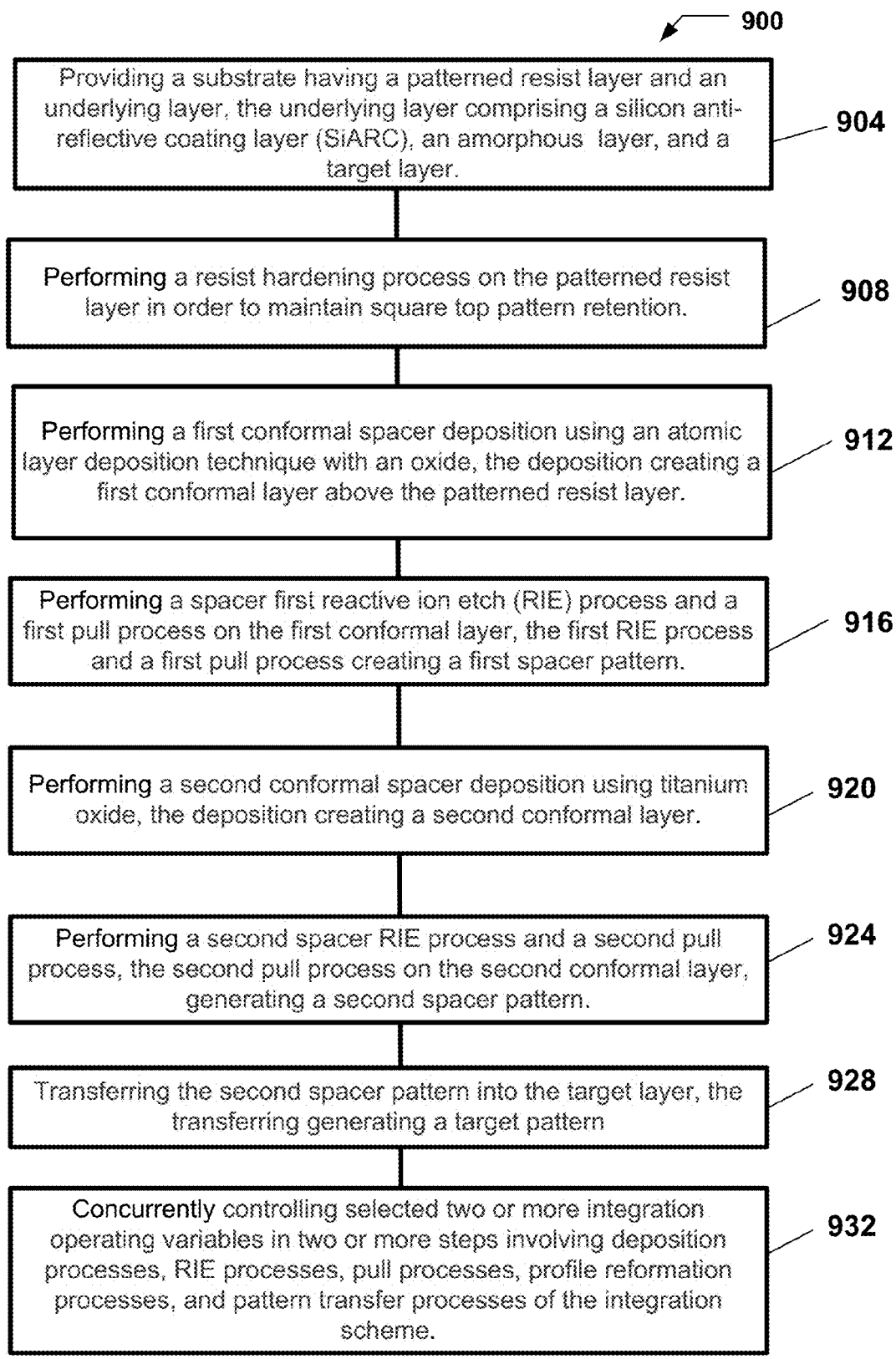
FIG. 9A is an exemplary process flow chart of the method of performing SAQP without using hard mandrels in an embodiment of the present invention.

FIG. 9A is an exemplary process flow chart 900 of the method of performing SAQP without using hard mandrels in an embodiment of the present invention. In general, the processes involving deposition processes, RIE processes, pull processes, profile reformation processes, and pattern transfer processes of the integration scheme discussed below are known in the art. However, the specific items that are different shall be discussed and highlighted in order to distinguish the operation from known art. In operation 904, a substrate having a patterned resist layer and an underlying layer, the underlying layer comprising a silicon anti-reflective coating layer (SiARC), an amorphous layer, and a target layer is provided in the processing chamber of an etch system. In operation 908, a resist hardening process on the patterned resist layer is performed in order to maintain square top pattern retention. In operation 912, a first conformal spacer deposition using an atomic layer deposition technique with an oxide, the deposition creating a first conformal layer above the patterned resist layer is performed. In operation 916, a spacer first reactive ion etch (RIE) process and a first pull process are performed on the first conformal layer, the first RIE process and a first pull process creating a first spacer pattern.

In operation 920, a second conformal spacer deposition is performed using titanium oxide, the deposition creating a second conformal layer. In operation 924, a second spacer RIE process and a second pull process are performed, the second pull process on the second conformal layer, generating a second spacer pattern. In operation 928, the second spacer pattern is transferred into the target layer. In operation 932, selected two or more integration operating variables are concurrently controlled in two or more steps involving deposition processes, RIE processes, pull processes, profile reformation processes, and/or pattern transfer processes of the integration scheme. Selection of two or more integrating operating variables and concurrent control using a controller described in connection with FIG. 10 and the ranges of the operating variables are critical factors that the inventors found that produced the results and made the SAQP results achievable by the present invention. Furthermore, tight continuous and concurrent control of the selected operating variables in order to achieve the targets patterning uniformity (uniformity), pulldown of structures (pulldown), slimming of structures (slimming), aspect ratio of structures (aspect ratio), and line width roughness (LWR) and line edge roughness (LER) also further contributed to obtaining results verified using imaging techniques after the processes were performed.

Figure 9B:
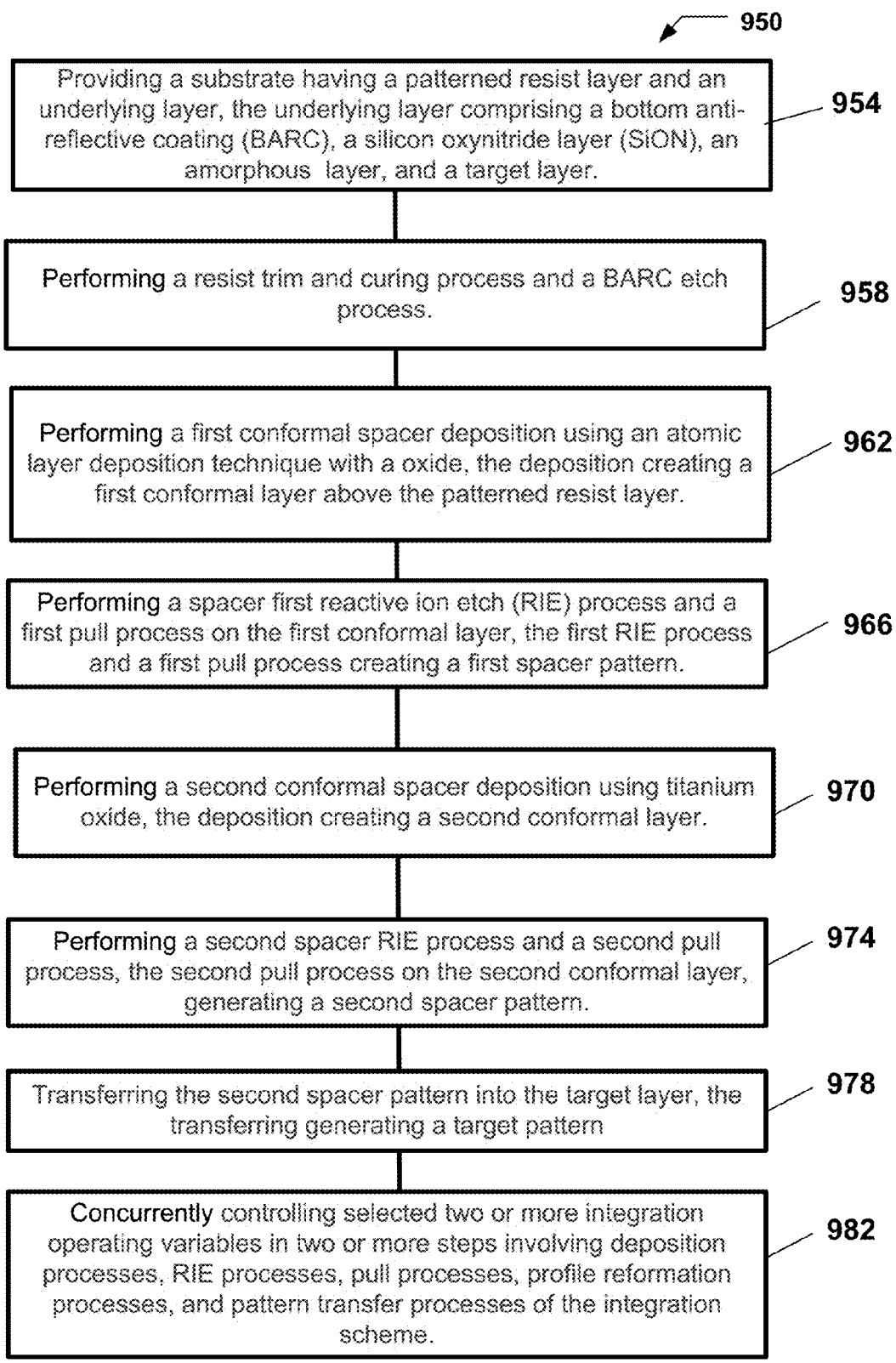
FIG. 9B is an exemplary process flow chart of the method of performing SAQP without using hard mandrels in an embodiment of the present invention.

FIG. 9B is an exemplary process flow chart 950 of the method of performing SAQP without using hard mandrels in another embodiment of the present invention. In operation 954, a substrate having a patterned resist layer and an underlying layer, the underlying layer comprising a bottom anti-reflective coating (BARC), a silicon oxynitride layer (SiON), an amorphous layer, and a target layer is provided in a processing chamber of an etch system. In operation 958, a resist trim and curing process and a BARC etch process are performed. In operation 962, a first conformal spacer deposition using an atomic layer deposition technique with a oxide is performed, the deposition creating a first conformal layer above the patterned resist layer.

In operation 966, a spacer first reactive ion etch (RIE) process and a first pull process are performed on the first conformal layer, the first RIE process and a first pull process creating a first spacer pattern. In operation 970, a second conformal spacer deposition is performed using titanium oxide, the deposition creating a second conformal layer. In operation 974, a second spacer RIE process and a second pull process, the second pull process are performed on the second conformal layer, generating a second spacer pattern. In operation 978, the second spacer pattern is transferred into the target layer, the transferring generating a target pattern. In operation 982, selected two or more integration operating variables are concurrently controlled in two or more steps involving deposition processes, RIE processes, pull processes, profile reformation processes, and pattern transfer processes of the integration scheme.

As mentioned above, selection of two or more integrating operating variables and concurrent control using a controller described in connection with FIG. 10 and the ranges of the operating variables are critical factors that the inventors found made the SAQP results achievable by the present invention. Furthermore, tight continuous and concurrent control of the selected operating variables in or order to achieve the targets patterning uniformity (uniformity), pulldown of structures (pulldown), slimming of structures (slimming), aspect ratio of structures (aspect ratio), and line width roughness (LWR) and line edge roughness (LER) also further contributed to obtaining results verified using imaging techniques after the processes were performed.

The aspect ratio of the target pattern can be in a range from 1:5 to 1:7 nm. The target roughness improvement of the first spacer pattern and/or the second spacer pattern can be in the range from 0.8 to 1.6 nm. The deposition temperature of the first conformal deposition and/or the second conformal deposition can be in a range from 25 to 130 degrees C., etch selectivity can be 4 or higher on the ALD oxide to the underlying layer, etch selectivity can be higher than 4 on the titanium oxide to the underlying layer, and etch selectivity in the first spacer pull can be 5 or higher for the ALD oxide to the underlying layer. (Please check these ranges.)

Figure 10:
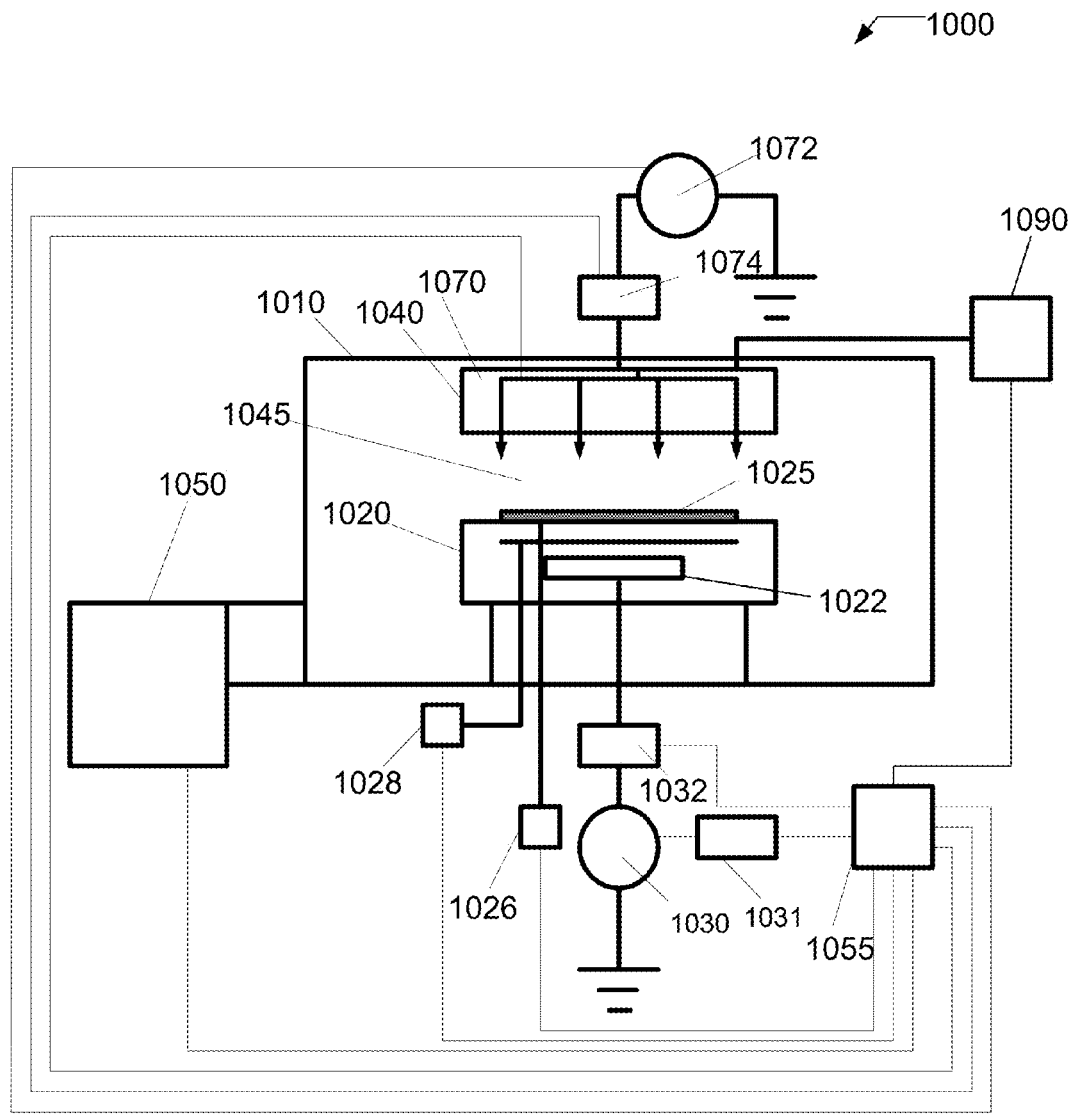
FIG. 10 is an exemplary systems chart for performing the method of SAQP without using hard mandrels in an embodiment of the present invention.

FIG. 10 is an exemplary systems chart 1000 for performing the method of SAQP without using hard mandrels in an embodiment of the present invention. A plasma etching system 1000 configured to perform the above identified process conditions is depicted in FIG. 10 comprising a plasma processing chamber 1010, substrate holder 1020, upon which a substrate 1025 to be processed is affixed, and vacuum pumping system 1050. Substrate 1025 can be a semiconductor substrate, a wafer, a flat panel display, or a liquid crystal display. Plasma processing chamber 1010 can be configured to facilitate the generation of plasma in plasma processing region 1045 in the vicinity of a surface of substrate 1025. An ionizable gas or mixture of process gases is introduced via a gas distribution system 1040. For a given flow of process gas, the process pressure is adjusted using the vacuum pumping system 1050. Plasma can be utilized to create materials specific to a pre-determined materials process, and/or to aid the removal of material from the exposed surfaces of substrate 1025. The plasma processing system 1000 can be configured to process substrates of any desired size, such as 200 mm substrates, 300 mm substrates, or larger.

Substrate 1025 can be affixed to the substrate holder 1020 via a clamping system 1028, such as a mechanical clamping system or an electrical clamping system (e.g., an electrostatic clamping system). Furthermore, substrate holder 1020 can include a heating system (not shown) or a cooling system (not shown) that is configured to adjust and/or control the temperature of substrate holder 1020 and substrate 1025. The heating system or cooling system may comprise a re-circulating flow of heat transfer fluid that receives heat from substrate holder 1020 and transfers heat to a heat exchanger system (not shown) when cooling, or transfers heat from the heat exchanger system to substrate holder 1020 when heating. In other embodiments, heating/cooling elements, such as resistive heating elements, or thermo-electric heaters/coolers can be included in the substrate holder 1020, as well as the chamber wall of the plasma processing chamber 1010 and any other component within the plasma processing system 1000.

Additionally, a heat transfer gas can be delivered to the backside of substrate 1025 via a backside gas supply system 1026 in order to improve the gas-gap thermal conductance between substrate 1025 and substrate holder 1020. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 1025.

In the embodiment shown in FIG. 10, substrate holder 1020 can comprise an electrode 1022 through which RF power is coupled to the processing plasma in plasma processing region 1045. For example, substrate holder 1020 can be electrically biased at a RF voltage via the transmission of RF power from a RF generator 1030 through an optional impedance match network 1032 to substrate holder 1020. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of electrode 1022 at a RF voltage may be pulsed using pulsed bias signal controller 1031. The RF power output from the RF generator 1030 may be pulsed between an off-state and an on-state, for example. Alternately, RF power is applied to the substrate holder electrode at multiple frequencies. Furthermore, impedance match network 1032 can improve the transfer of RF power to plasma in plasma processing chamber 1010 by reducing the reflected power. Match network topologies (e.g. L-type, □-type, T-type, etc.) and automatic control methods are well known to those skilled in the art.

Gas distribution system 1040 may comprise a showerhead design for introducing a mixture of process gases. Alternatively, gas distribution system 1040 may comprise a multi-zone showerhead design for introducing a mixture of process gases and adjusting the distribution of the mixture of process gases above substrate 1025. For example, the multi-zone showerhead design may be configured to adjust the process gas flow or composition to a substantially peripheral region above substrate 1025 relative to the amount of process gas flow or composition to a substantially central region above substrate 1025.

Vacuum pumping system 1050 can include a turbo-molecular vacuum pump (TMP) capable of a pumping speed up to about 8000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 1010.

As mentioned above, the controller 1055 can comprise a microprocessor, memory, and a digital I/O port capable of generating control voltages sufficient to communicate and activate inputs to plasma processing system 1000 as well as monitor outputs from plasma processing system 1000. Moreover, controller 1055 can be coupled to and can exchange information with RF generator 1030, pulsed bias signal controller 1031, impedance match network 1032, the gas distribution system 1040, vacuum pumping system 1050, as well as the substrate heating/cooling system (not shown), the backside gas supply system 1026, and/or the electrostatic clamping system 1028. For example, a program stored in the memory can be utilized to activate the inputs to the aforementioned components of plasma processing system 1000 according to a process recipe in order to perform a plasma assisted process, such as a plasma etch process, on substrate 1025.

In addition, the plasma processing system 1000 can further comprise an upper electrode 1070 to which RF power can be coupled from RF generator 1072 through optional impedance match network 1074. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 1055 is coupled to RF generator 1072 and impedance match network 1074 in order to control the application of RF power to upper electrode 1070. The design and implementation of an upper electrode is well known to those skilled in the art. The upper electrode 1070 and the gas distribution system 1040 can be designed within the same chamber assembly, as shown. Alternatively, upper electrode 1070 may comprise a multi-zone electrode design for adjusting the RF power distribution coupled to plasma above substrate 1025. For example, the upper electrode 1070 may be segmented into a center electrode and an edge electrode.

Depending on the applications, additional devices such as sensors or metrology devices can be coupled to the plasma processing chamber 1010 and to the controller 1055 to collect real time data and use such real time data to concurrently control two or more selected integration operating variables in two or more steps involving deposition processes, RIE processes, pull processes, profile reformation processes, and/or pattern transfer processes of the integration scheme. Furthermore, the same data can be used to ensure integration targets including patterning uniformity (uniformity), pulldown of structures (pulldown), slimming of structures (slimming), aspect ratio of structures (aspect ratio), line width roughness, and the like are achieved.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method for increasing pattern density of a structure on a substrate using an integration scheme, the integration scheme configured to meet integration targets, to perform pitch splitting at the resist level and without the use of hard mandrels, the method comprising:
   providing a substrate having a patterned resist layer and an underlying layer, the underlying layer comprising a silicon anti-reflective coating layer (SiARC), an amorphous layer, and a target layer;
   performing a resist hardening process on the patterned resist layer in order to maintain square top pattern retention;
   performing a first conformal spacer deposition using an atomic layer deposition technique with an oxide, the deposition creating a first conformal layer above the patterned resist layer;
   performing a spacer first reactive ion etch (RIE) process and a first pull process on the first conformal layer, the first RIE process and a first pull process creating a first spacer pattern;
   performing a first profile reformation process configured to adjust a line width roughness (LWR) and line edge roughness (LER) of the first spacer pattern by coating the first spacer pattern with an organic planarizing layer (OPL) and etching a partial etch back on the first spacer pattern;
   performing, after the first profile reformation process, a second conformal spacer deposition using titanium oxide, the deposition creating a second conformal layer;
   performing a second spacer RIE process and a second pull process, the second pull process on the second conformal layer, generating a second spacer pattern; and
   transferring the second spacer pattern into the target layer, the transferring generating a target pattern;
   wherein the integration targets include patterning uniformity (uniformity), pulldown of structures (pulldown), slimming of structures (slimming), aspect ratio of structures (aspect ratio), and line width roughness.

2. The method of claim 1 further comprising:
   concurrently controlling selected two or more integration operating variables in two or more steps involving deposition processes, RIE processes, pull processes, profile reformation processes, and pattern transfer processes of the integration scheme.

3. The method of claim 2:
   wherein the underlying layer was formed using an amorphous carbon deposition deposited using chemical vapor deposition (CVD) or a spin on carbon followed by a SiARC spin on layer; and
   wherein the first conformal atomic layer deposition with an oxide comprises SIO2.

4. The method of claim 3 wherein the first spacer RIE process is performed with a first spacer pattern pulldown of less than 10 nm.

5. The method of claim 4 wherein the first spacer RIE process and the second RIE process use a high density plasma with low plasma potential to limit pulldown due to ion impingement on corners of the first spacer pattern and/or the second spacer pattern.

6. The method of claim 5 wherein the first spacer RIE process uses an inductively coupled plasma (ICP) source or capacitively coupled plasma (CCP) with pulsing capability.

7. The method of claim 6 wherein the first pull process utilized CH3F/O2/Ar, CH3/H2/Ar or CH3/H2/He.

8. The method of claim 7 wherein the second pull process utilized a mixture of hydrogen bromide and oxygen or chlorine and hydrogen.

9. The method of claim 1 wherein:
   the aspect ratio of the target pattern is in a range from 1:5 to 1:7.

10. The method of claim 1 wherein:
    a deposition temperature of the first conformal deposition and/or the second conformal deposition is in a range from 25 to 130 degrees C., etch selectivity of 4 or higher on the ALD oxide to the underlying layer, etch selectivity higher than 4 on the titanium oxide to the underlying layer, and etch selectivity in the first spacer pull is 5 or higher for the ALD oxide to the underlying layer.

11. The method of claim 1 wherein:
    the resist hardening process comprises a plasma cure process during which vacuum ultra violet radiation (VUV) of a plasma with ion flux/radial species densify the resist; and
    wherein the plasma cure includes HBr, H2, Ar plasmas with additive gases including CH4.

12. The method of claim 1 wherein:
    the first spacer RIE process is performed with a CxFy based chemistry with dilution gas such as Ar or He and the first pull process is performed with an oxygen plasma with low bias radio frequency (RF) radiation in the range from 1 to 50 mHz.

13. The method of claim 1 wherein:
the second RIE process is performed using a BCl3 plasma and the second pull process is performed with an oxygen plasma with low bias radio frequency (RF) radiation in the range from 1 to 50 mHz.

14. A method for increasing pattern density of a structure on a substrate using an integration scheme, the integration scheme configured to meet integration targets, to perform pitch splitting at the resist level and without the use of hard mandrels, the method comprising:
providing a substrate having a patterned resist layer and an underlying layer, the underlying layer comprising a bottom anti-reflective coating (BARC), a silicon oxynitride layer (SiON), an amorphous layer, and a target layer;
performing a resist trim and curing process and a BARC etch process;
performing a first conformal spacer deposition using an atomic layer deposition technique with an oxide, the deposition creating a first conformal layer above the patterned resist layer;
performing a spacer first reactive ion etch (RIE) process and a first pull process on the first conformal layer, the first RIE process and a first pull process creating a first spacer pattern;
performing a first profile reformation process configured to adjust a line width roughness (LWR) and line edge roughness (LER) of the first spacer pattern by coating the first spacer pattern with an organic planarizing layer (OPL) and etching a partial etch back on the first spacer pattern;
performing, after performing the first profile reformation process, a second conformal spacer deposition using titanium oxide, the deposition creating a second conformal layer;
performing a second spacer RIE process and a second pull process, the second pull process on the second conformal layer, generating a second spacer pattern; and
transferring the second spacer pattern into the target layer, the transferring generating a target pattern;
wherein the integration targets include patterning uniformity (uniformity), pulldown of structures (pulldown), slimming of structures (slimming), aspect ratio of structures (aspect ratio), and line width roughness;
wherein the atomic layer deposition with an oxide comprises one of Al2O3, ZrO2, HfO2, RuO, or AlN.

15. The method of claim 14:
wherein the first profile reformation process is configured to improve line width roughness (LWR) and line edge roughness (LER) of the first spacer pattern, the first profile reformation process further comprising:
reforming the first spacer pattern with an etch process with high selectivity to the OPL relative to the underlying layer.

16. The method of claim 15, further comprising:
performing a second profile reformation process configured to improve LWR and LER of the second spacer pattern, the reformation process comprising:
coating the second spacer pattern with an OPL and etching a partial etch back on the second spacer pattern; and
reforming the second spacer pattern with an etch process with high selectivity to the OPL relative to the underlying layer.

17. The method in claim 16:
wherein a roughness improvement of the first spacer pattern and/or the second spacer pattern is in the range from 0.8 to 1.6 nm.

18. The method of claim 14 wherein:
all processes prior to transferring the second spacer pattern into the target layer are all performed above the underlying layer.

19. The method of claim 14 wherein:
the first spacer RIE and first spacer pull process and the second spacer RIE and second spacer pull process are performed without using a hard mandrel.

20. The method of claim 14 wherein all manufacturing processes of the integration scheme are performed using a processing chamber.

* * * * *